United States Patent
Ishii et al.

(10) Patent No.: US 12,277,027 B2
(45) Date of Patent: Apr. 15, 2025

(54) MEMORY CONTROL CIRCUIT, MEMORY, AND MEMORY MODULE

(71) Applicant: SONY SEMICONDUCTOR SOLUTIONS CORPORATION, Kanagawa (JP)

(72) Inventors: Ken Ishii, Kanagawa (JP); Haruhiko Terada, Kanagawa (JP); Riichi Nishino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 18 days.

(21) Appl. No.: 18/245,969

(22) PCT Filed: Aug. 23, 2021

(86) PCT No.: PCT/JP2021/030834
§ 371 (c)(1),
(2) Date: Mar. 20, 2023

(87) PCT Pub. No.: WO2022/074947
PCT Pub. Date: Apr. 14, 2022

(65) Prior Publication Data
US 2023/0385147 A1 Nov. 30, 2023

(30) Foreign Application Priority Data

Oct. 8, 2020 (JP) .................................. 2020-170373

(51) Int. Cl.
*G06F 11/00* (2006.01)
*G06F 11/10* (2006.01)

(52) U.S. Cl.
CPC ................................ *G06F 11/1044* (2013.01)

(58) Field of Classification Search
CPC ............. G06F 11/1044; G06F 11/0727; G06F 11/1076; G06F 11/108
See application file for complete search history.

(56) References Cited

U.S. PATENT DOCUMENTS

| 2013/0179748 | A1* | 7/2013 | Dong | G06F 11/1012 714/755 |
| 2014/0068378 | A1* | 3/2014 | Yoshii | G06F 11/1012 714/764 |

(Continued)

FOREIGN PATENT DOCUMENTS

| JP | 01-286060 A | 11/1989 |
| JP | 06-131884 A | 5/1994 |

(Continued)

OTHER PUBLICATIONS

International Search Report and Written Opinion of PCT Application No. PCT/JP2021/030834, issued on Nov. 9, 2021, 10 pages of ISRWO.

*Primary Examiner* — Joseph D Manoskey
(74) *Attorney, Agent, or Firm* — CHIP LAW GROUP

(57) ABSTRACT

Provided is a memory access control unit that performs writing by dividing write data and an error correction code thereof into a plurality of memories, and acquires presence or absence of occurrence of a verify error in each of the plurality of memories related to the writing. In a case where the verify errors occur in at least any of the plurality of memories, an error bit length acquisition unit acquires bit lengths of the verify errors from the plurality of memories and a write control unit determines that the writing has succeeded if a total bit length of the verify errors falls within a range of a capability allocated to an error bit length tolerance of the error correction code, and determines that the writing has failed if the total bit length of the verify errors falls outside the range.

14 Claims, 16 Drawing Sheets

(56) References Cited

U.S. PATENT DOCUMENTS

| 2015/0143185 | A1* | 5/2015 | Motwani | G06F 11/1048 |
| | | | | 714/718 |
| 2022/0283897 | A1* | 9/2022 | Yang | G06F 11/1068 |

FOREIGN PATENT DOCUMENTS

| JP | 2000-215687 A | 8/2000 |
| JP | 2004-095145 A | 3/2004 |
| JP | 2014-232540 A | 12/2014 |
| JP | 2019-193384 A | 10/2019 |

\* cited by examiner

MEMORY CONTROL CIRCUIT, MEMORY, AND MEMORY MODULE

CROSS REFERENCE TO RELATED APPLICATIONS

This application is a U.S. National Phase of International Patent Application No. PCT/JP2021/030834 filed on Aug. 23, 2021, which claims priority benefit of Japanese Patent Application No. JP 2020-170373 filed in the Japan Patent Office on Oct. 8, 2020. Each of the above-referenced applications is hereby incorporated herein by reference in its entirety.

TECHNICAL FIELD

The present technology relates to a memory module. Specifically, the present invention relates to a memory control circuit, a memory, and a memory module that detect a verify error at the time of data writing.

BACKGROUND ART

Conventionally, when a write operation is performed in a flash memory or the like, a process of performing reading to confirm whether or not the writing has been correctly performed and verifying a match between write data and read data is performed. For example, there is proposed a flash memory system that performs verification after writing and determines that a data change has succeeded if the number of pieces of data considered to have failed in the data change is equal to or less than a correctable number (see, for example, Patent Document 1).

CITATION LIST

Patent Document

Patent Document 1: Japanese Patent Application Laid-Open No. 2004-095145

SUMMARY OF THE INVENTION

Problems to be Solved by the Invention

In the above-described related art, the verification is performed on one memory, and it is treated as a writing failure if the correction is not possible. However, in a case where a memory module is configured using a plurality of memories in the future, determination of the verification by individual memories is insufficient, and there is a possibility that an available range of the memories is narrowed.

The present technology has been made in view of such a situation, and an object thereof is to effectively use a memory when a plurality of memories is combined to constitute a memory module.

Solutions to Problems

The present technology has been made to solve the above-described problems, and a first aspect thereof is a memory control circuit including: a memory access control unit that performs writing by dividing write data and an error correction code for the write data into a plurality of memories and acquires presence or absence of occurrence of a verify error in each of the plurality of memories related to the writing; an error bit length acquisition unit that acquires bit lengths of the verify errors from the plurality of memories in a case where the verify errors occur in at least any of the plurality of memories; and a write control unit that determines that the writing has succeeded if a total bit length of the verify errors falls within a range of a capability allocated to an error bit length tolerance of the error correction code, and determines that the writing has failed if the total bit length of the verify errors falls outside the range of the capability allocated to the error bit length tolerance of the error correction code in the case where the verify errors occur in at least any of the plurality of memories. This brings about an effect that the bit lengths of the verify errors are acquired from the plurality of memories in the case where the verify errors occur to determine that the writing has succeeded if the total bit length of the verify errors falls within the range of the capability allocated to the error bit length tolerance of the error correction code.

Furthermore, in the first aspect, an error correction code generation unit that generates the error correction code for the write data may be further provided.

Furthermore, in the first aspect, the error bit length acquisition unit may request the plurality of memories for the bit lengths of the verify errors related to the writing after the presence or absence of the occurrence of the verify error is output from all of the plurality of memories related to the writing.

Furthermore, in the first aspect, in a case where the writing has been performed a plurality of times, the error bit length acquisition unit may designate any of the plurality of times of the writing to request the plurality of memories for the bit lengths of the verify errors. This brings about an effect that the bit length of the verify error related to desired writing is acquired even in a case where writing is continuously performed with respect to the plurality of memories.

Furthermore, in the first aspect, in a case where each of the plurality of memories includes a plurality of memory banks, the error bit length acquisition unit may designate any of the plurality of memory banks to request the plurality of memories for the bit lengths of the verify errors. This brings about an effect that the bit length of the verify error for a specific memory bank is acquired in the case where the memory bank configuration is provided.

Furthermore, in the first aspect, the memory access control unit may acquire the presence or absence of the occurrence of another error by a signal having a pulse width different from a signal for providing a notification of the occurrence of the verify error in a signal line for acquiring the presence or absence of the occurrence of the verify error. This brings about an effect that the presence or absence of the occurrence of another error is acquired using the signal line for acquiring the presence or absence of the occurrence of the verify error.

Furthermore, in the first aspect, the memory access control unit may acquire presence or absence of occurrence of a memory cell failure from the plurality of memories in the case where the verify errors occur in at least any of the plurality of memories. This brings about an effect of performing failure control against the memory cell failure.

Furthermore, a second aspect of the present technology is a memory including: a memory cell array that performs a write operation of write data in response to a write request; a write completion determination unit that provides a notification of presence or absence of occurrence of a verify error in the write operation; and a verify error bit length holding unit that holds a bit length of the verify error in the write operation and outputs the bit length of the verify error in response to a request from outside. This brings about an effect that the bit length of the verify error is supplied in response to request from the outside when the verify error occurs.

Furthermore, in the second aspect, in a case where the write operation is performed a plurality of times, the verify error bit length holding unit may hold the bit lengths of the verify errors of at least most recent two times among the plurality of write operations. This brings about an effect that the bit length of the verify error related to desired writing is supplied even in a case where writing is continuously performed with respect to the memory.

Furthermore, in the second aspect, the memory cell array may include a plurality of memory banks, and the verify error bit length holding unit may hold the bit length of the verify error in the write operation for each of the plurality of memory banks. This brings about an effect that the bit length of the verify error for a specific memory bank is supplied in the case where the memory bank configuration is provided.

Furthermore, in the second aspect, the write completion determination unit may provide a notification of presence or absence of occurrence of another error using a signal having a different pulse width from a signal providing a notification of the occurrence of the verify error in a signal line for providing a notification of the presence or absence of the occurrence of the verify error. This brings about an effect that the presence or absence of the occurrence of another error is supplied using the signal line for acquiring the presence or absence of the occurrence of the verify error.

Furthermore, in the second aspect, a memory cell failure occurrence holding unit that holds presence or absence of occurrence of a memory cell failure in the memory cell array and outputs the presence or absence of the occurrence of the memory cell failure in response to a request from outside may be further provided. This brings about an effect of performing failure control against the memory cell failure.

Furthermore, in the second aspect, the memory cell array may be a non-volatile memory.

Furthermore, the second aspect of the present technology is a memory module including: a plurality of memories respectively including verify error bit length holding units each of which holds a bit length of a verify error in a write operation; a memory access control unit that performs writing by dividing write data and an error correction code for the write data into the plurality of memories and acquires presence or absence of occurrence of the verify error in each of the plurality of memories related to the writing; an error bit length acquisition unit that acquires the bit lengths of the verify errors from the verify error bit length holding units of the plurality of memories in a case where the verify errors occur in at least any of the plurality of memories; and a write control unit that determines that the writing has succeeded if a total bit length of the verify errors falls within a range of a capability allocated to an error bit length tolerance of the error correction code, and determines that the writing has failed if the total bit length of the verify errors falls outside the range of the capability allocated to the error bit length tolerance of the error correction code in the case where the verify errors occur in at least any of the plurality of memories. This brings about an effect that the bit lengths of the verify errors in the plurality of memories are acquired in the case where the verify errors occur to determine that the writing has succeeded if the total bit length of the verify errors falls within the range of the capability allocated to the error bit length tolerance of the error correction code.

MODE FOR CARRYING OUT THE INVENTION

Hereinafter, modes for carrying out the present technology (hereinafter, referred to as embodiments) will be described. The description will be given in the following order.

1. First Embodiment (Example of Holding Verify Error Bit Length in Non-Volatile Memory)
2. Second Embodiment (Example of Holding Verify Error Bit Lengths for Two Requests)
3. Third Embodiment (Example of Holding Verify Error Bit Length for Each Memory Bank)
4. Fourth Embodiment (Example of Providing Notification of Another Error Using Signal Line of Verify Status)
5. Fifth Embodiment (Example of Holding Presence or Absence of Occurrence of Memory Cell Failure in non-volatile Memory)

1. First Embodiment

[Configuration of Information Processing System]

Figure 1:
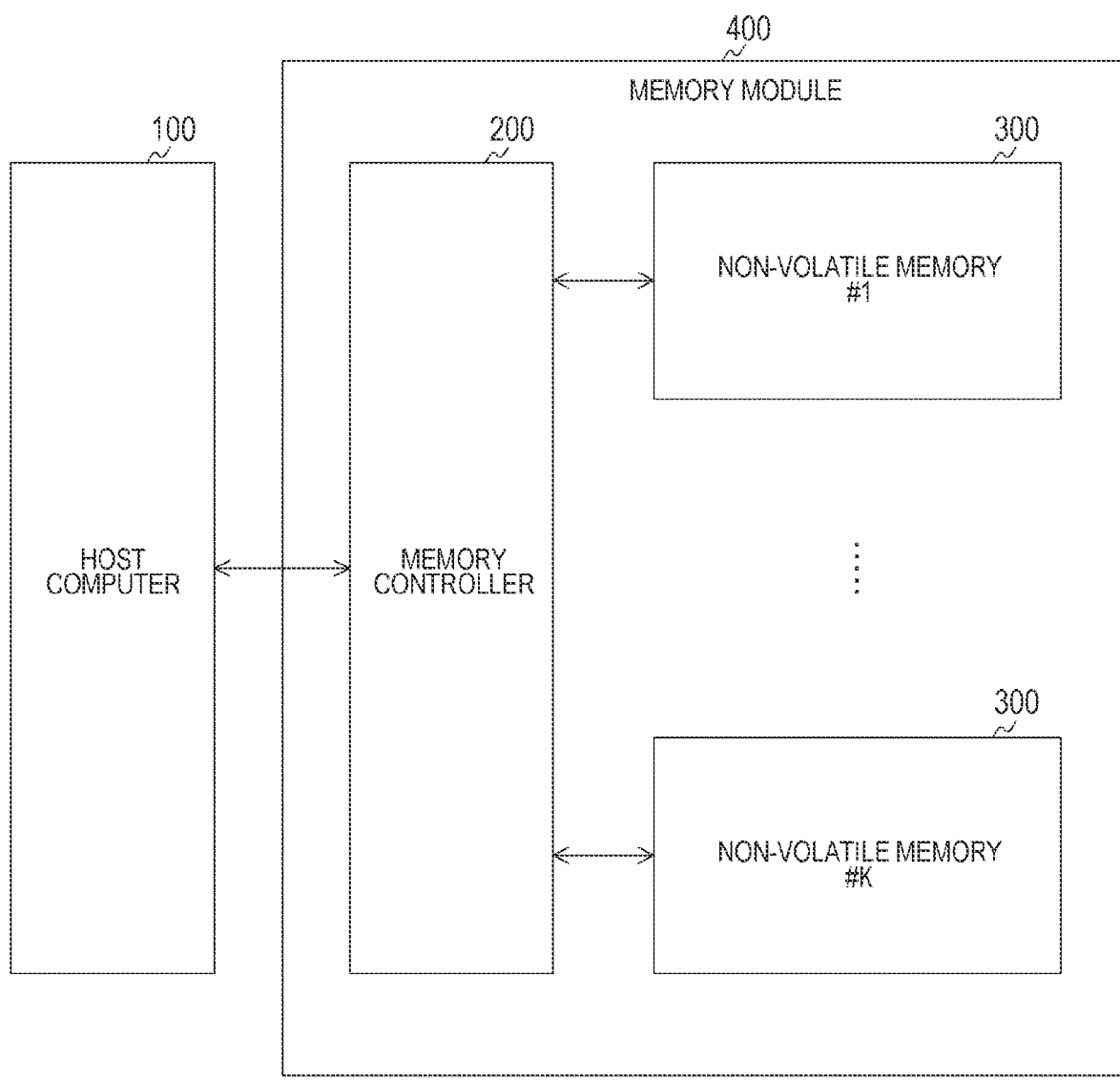
FIG. 1 is a diagram illustrating a configuration example of an information processing system in an embodiment of the present technology.

FIG. 1 is a diagram illustrating a configuration example of an information processing system in an embodiment of the present technology.

The information processing system includes a host computer 100, a memory controller 200, and a plurality of non-volatile memories 300. The memory controller 200 and the non-volatile memories 300 constitute a memory module 400. Note that K dies of the non-volatile memories 300 are assumed here. Here, K is an integer of two or more.

The host computer 100 issues a command for instructing the non-volatile memory 300 to perform data read processing, write processing, or the like. The host computer 100 includes a processor that executes processing as the host computer 100 and a controller interface for performing communication with the memory controller 200.

The memory controller 200 performs request control with respect to the non-volatile memory 300 according to the command from the host computer 100. Note that the memory controller 200 is an example of a memory control circuit described in the claims.

Each of the plurality of non-volatile memories 300 includes a control unit and a memory cell array as described later. The control unit of the non-volatile memory 300 accesses the memory cell array according to a request from the memory controller 200. Note that the non-volatile memory 300 is an example of a memory described in the claims.

The memory cell array of the non-volatile memory 300 is assumed to be a non-volatile memory (NVM) in which data of a plurality of byte sizes (for example, 64 bytes) is used as the unit of access for reading or writing and data can be overwritten without erasing. As such a memory, a storage class memory (SCM) is assumed. The storage class memory is positioned between a dynamic random access memory (DRAM) and a flash memory, and requires a low latency.

[Configuration of Non-Volatile Memory]

Figure 2:
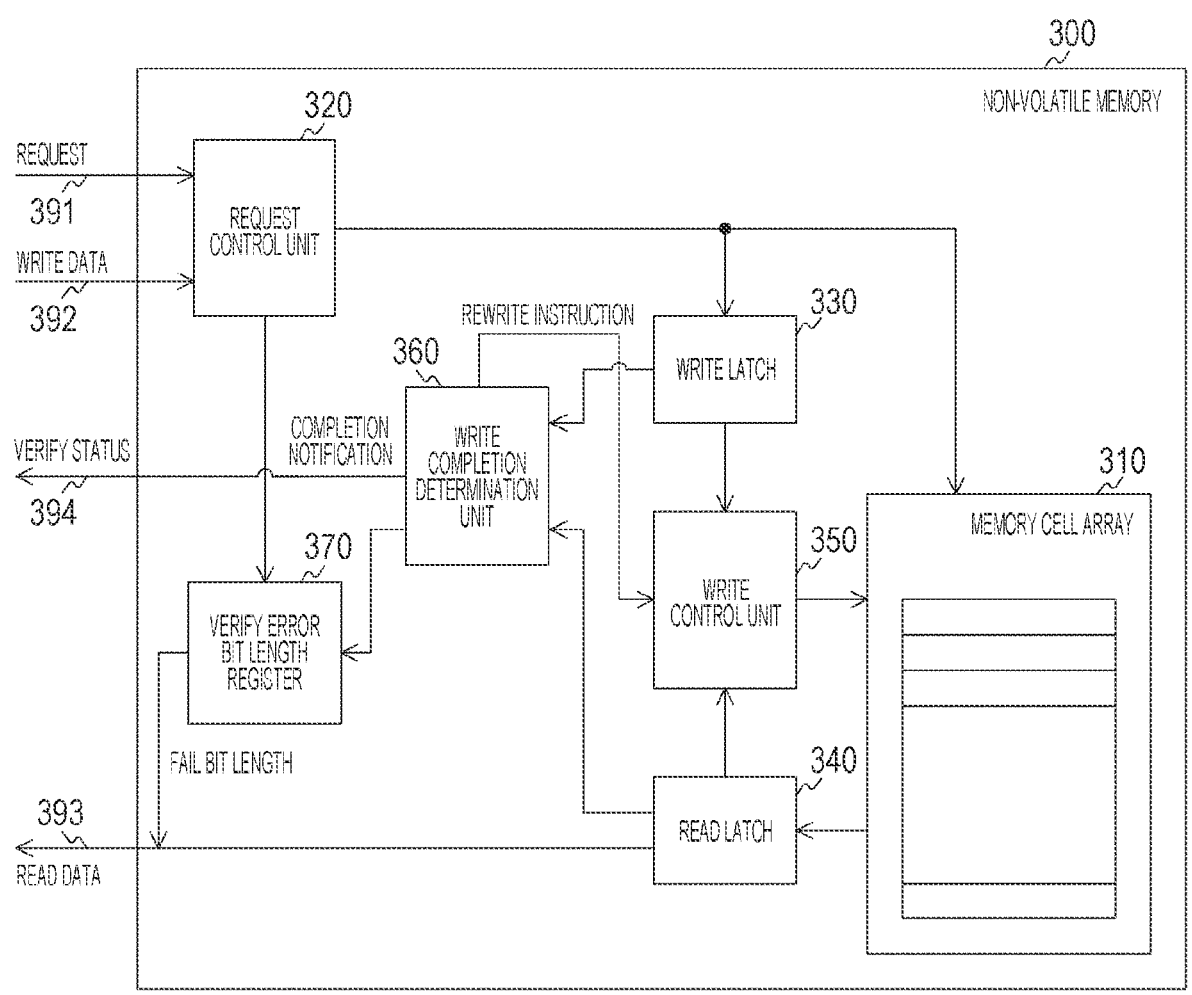
FIG. 2 is a diagram illustrating a configuration example of a non-volatile memory 300 in a first embodiment of the present technology.

FIG. 2 is a diagram illustrating a configuration example of the non-volatile memory 300 in a first embodiment of the present technology.

As an interface between the non-volatile memory 300 and the memory controller 200, signal lines of a request 391, write data 392, read data 393, and a verify status 394 are connected. Note that it is assumed that the signal lines of the write data 392 and the read data 393 are separately provided in this example, but a bidirectional signal line such as a double-data-rate synchronous dynamic random access memory (DDR SDRAM) may be used.

The non-volatile memory 300 includes a memory cell array 310 and the control unit. The control unit includes a request control unit 320, a write latch 330, a read latch 340, a write control unit 350, a write completion determination unit 360, and a verify error bit length register 370.

The memory cell array 310 is a memory cell array including a plurality of memory cells, and is configured by arranging many memory cells storing any value of binary values for each bit or many memory cells storing any value of multiple values for each of a plurality of bits two-dimensionally (in a matrix).

The request control unit 320 controls access to the memory cell array 310 in response to a request from the memory controller 200. The request control unit 320 receives the request from the memory controller 200 through the signal line of the request 391. If the received request is a write request, the request control unit 320 receives write data from the signal line of the write data 392, supplies the write data to the write latch 330, and supplies a write address to the memory cell array 310 to perform a write operation. If the received request is a read request, a read address is supplied to the memory cell array 310 to perform a read operation.

The write latch 330 holds the write data to be written to the memory cell array 310. The read latch 340 holds read data read from the memory cell array 310. In the case of the read request, the read latch 340 outputs the held content to the signal line of the read data 393 according to an instruction from the request control unit 320.

The write control unit 350 controls the write operation with respect to the memory cell array 310. The write control unit 350 reads data stored in the write address that is a target of the write operation to the read latch 340 (pre-reading). Then, a content of the write latch 330 and the read latch 340 are compared for each bit, and program processing is performed only on a bit whose value is changed.

After the program processing is performed, the write completion determination unit 360 reads out data stored in the write address again to the read latch 340 and compares the read data with a content of the write latch 330 to verify the data. Therefore, the write completion determination unit 360 determines that writing has succeeded if contents of the both match and outputs a completion notification to the signal line of the verify status 394.

On the other hand, in a case where the contents of the both do not match, the write operation is ended if the number of bits having different values (a verify error bit length) is equal to or less than a predetermined N bits (N is an integer), and the completion notification is output to the signal line of the verify status 394. In a case where the verify error bit length is more than N bits, the write completion determination unit 360 supplies a rewrite instruction to the write control unit 350 to repeat the program processing until exceeding the maximum number of loops.

The verify error bit length register 370 is a register that holds the verify error bit length in the verification of the write completion determination unit 360. The verify error bit length register 370 outputs the number of fail bits (verify error bit length) to the signal line of the read data 393 according to an instruction from the request control unit 320. Note that the verify error bit length register 370 is an example of a verify error bit length holding unit described in the claims.

[Operation of Non-Volatile Memory]

Figure 3:
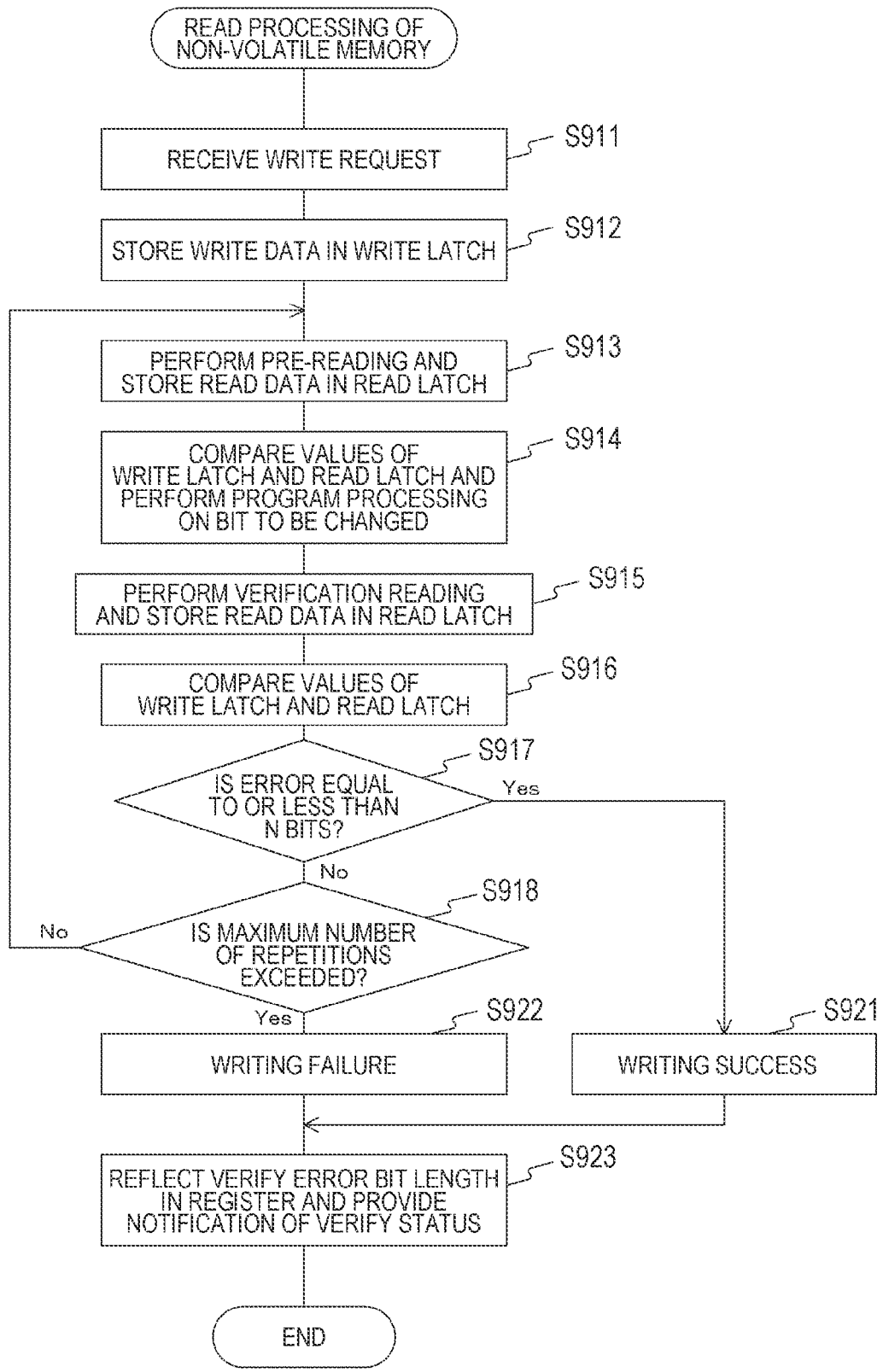
FIG. 3 is a flowchart illustrating an example of a write processing procedure of the non-volatile memory 300 in the first embodiment of the present technology.

FIG. 3 is a flowchart illustrating an example of a write processing procedure of the non-volatile memory 300 in the first embodiment of the present technology.

When receiving a write request from the memory controller 200 (step S911), the request control unit 320 stores write data in the write latch 330 (step S912).

The write control unit 350 performs pre-reading on the memory cell array 310 and stores data stored in a write address that is a target of a write operation in the read latch 340 (step S913). Then, the write control unit 350 compares values of the write latch 330 and the read latch 340, and performs program processing on a bit to be changed (step S914).

The write control unit 350 performs verification reading on the memory cell array 310 and stores data stored in a write address that is a target of a write operation in the read latch 340 (step S915). Then, the write control unit 350 compares values of the write latch 330 and the read latch 340, and performs verification (step S916).

As a result, if the verify error bit length is equal to or less than N bits (step S917: Yes), it is determined that the writing has succeeded (step S921), the verify error bit length is reflected in the verify error bit length register 370, and a completion notification indicating "pass" is output to the signal line of the verify status 394 (step S923).

On the other hand, in a case where the verify error bit length is more than N bits (step S917: No), processes after the pre-reading (step S913) are repeated if the maximum number of repetitions has not been exceeded (step S918: No). In a case where the maximum number of repetitions has been exceeded (step S918: Yes), it is determined that the writing has failed (step S922), the verify error bit length is reflected in the verify error bit length register 370, and a completion notification indicating "fail" is output to the signal line of the verify status 394 (step S923).

Figure 4:
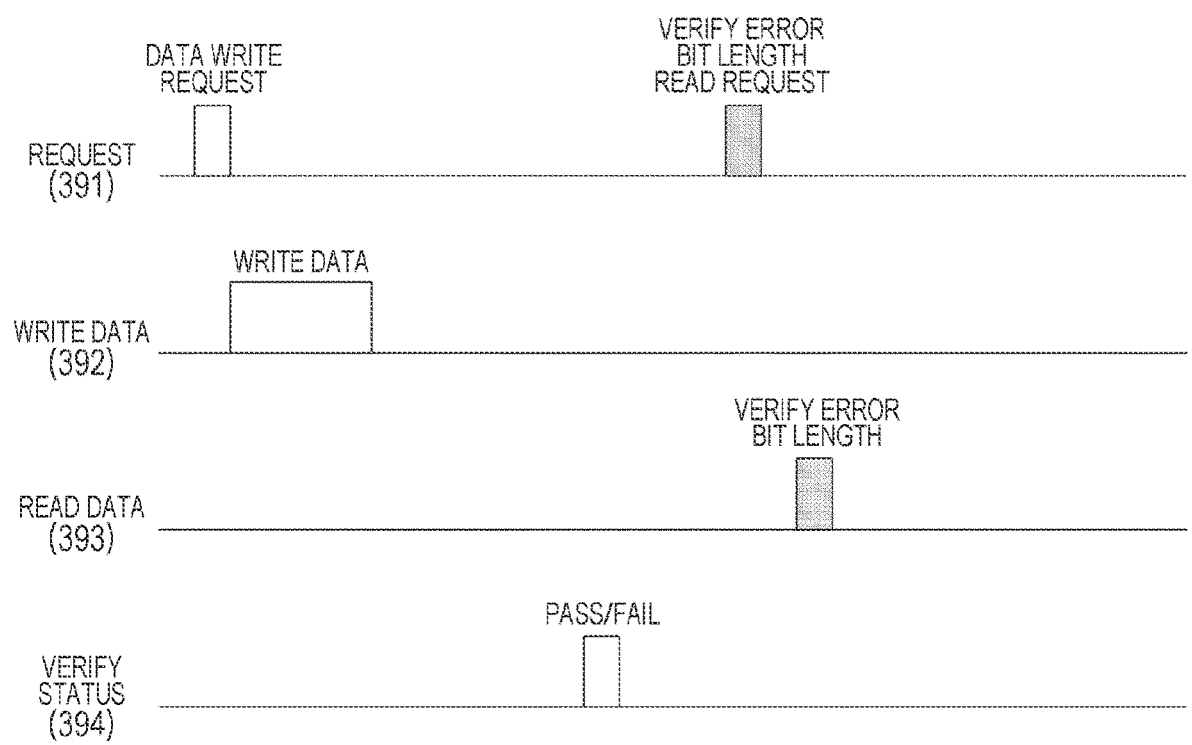
FIG. 4 is a diagram illustrating a timing example in an interface of a non-volatile memory 300 in the first embodiment of the present technology.

FIG. 4 is a diagram illustrating a timing example in the interface of the non-volatile memory 300 in the first embodiment of the present technology.

After a data write request is issued from the memory controller 200 to the signal line of the request 391, write data is output to the signal line of the write data 392. Thereafter, a write operation is performed in the memory cell array 310, and the write completion determination unit 360 outputs the completion notification indicating "pass" or "fail" to the signal line of the verify status 394.

Thereafter, when a verify error bit length read request is issued from the memory controller 200 to the signal line of the request 391, a verify error bit length is read from the verify error bit length register 370, and its value is output to the signal line of the read data 393.

[Configuration of Memory Controller]

Figure 5:
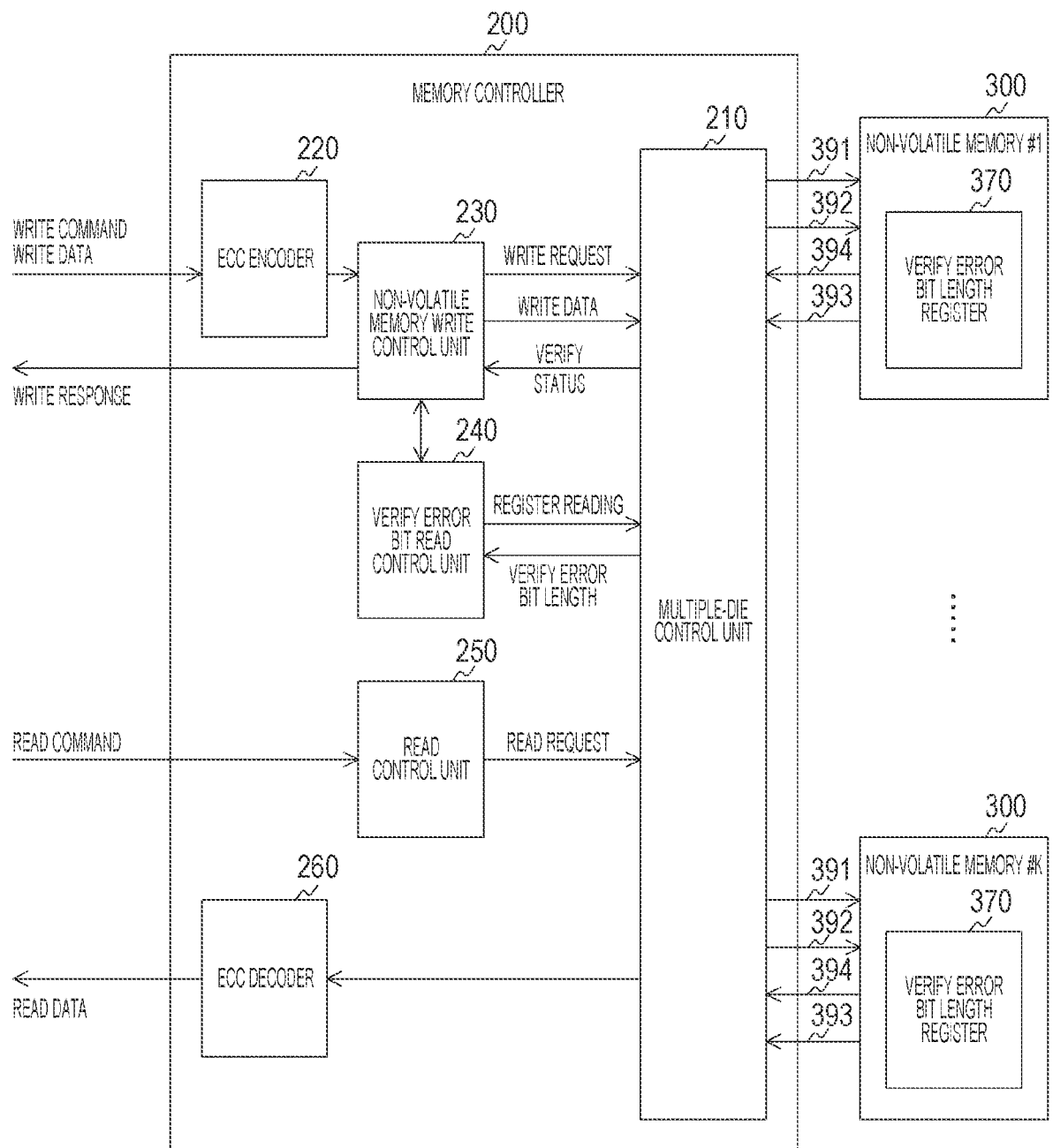
FIG. 5 is a diagram illustrating a configuration example of a memory controller 200 in the first embodiment of the present technology.

FIG. 5 is a diagram illustrating a configuration example of the memory controller 200 in the first embodiment of the present technology.

The memory controller 200 includes a multi-die control unit 210, an ECC encoder 220, a non-volatile memory write control unit 230, a verify error bit read control unit 240, a read control unit 250, and an ECC decoder 260.

The multi-die control unit 210 controls the plurality of dies of non-volatile memories 300 connected to the memory controller 200. The multi-die control unit 210 accesses the K dies of connected non-volatile memories 300 in parallel according to a command from the host computer 100. The multi-die control unit 210 divides data in the case of writing and combines data in the case of reading. In a case where at least one of verify statuses from the K dies of non-volatile memories 300 indicates "fail", "fail" is returned as a verify status for the non-volatile memory write control unit 230. Note that the multi-die control unit 210 is an example of a memory access control unit described in the claims.

The ECC encoder 220 generates an error correction code (ECC) for write data related to a write command from the host computer 100. The generated error correction code is supplied to the non-volatile memory write control unit 230 together with the write data. Note that the ECC encoder 220 is an example of an error correction code generation unit described in the claims.

The non-volatile memory write control unit 230 controls writing with respect to the non-volatile memory 300. When receiving the write command from the host computer 100, the non-volatile memory write control unit 230 generates a write request, and outputs the write request to the multi-die control unit 210 with writing. Therefore, the multi-die control unit 210 issues the write request to the K dies of non-volatile memories 300, and as a result, receives a verify status.

If the verify status from the multi-die control unit 210 is "fail", the non-volatile memory write control unit 230 instructs the verify error bit read control unit 240 to acquire a verify error bit length from the K dies of non-volatile memories 300. On the other hand, if the verify statuses 394 in all of the K dies of non-volatile memories 300 are "pass", the verify error bit length is unnecessary, and thus, is not acquired. Therefore, it is possible to avoid a situation in which the signal line of the read data 393 is wastefully consumed to degrade the performance of the non-volatile memory 300.

As a result of acquiring the verify error bit length, if a total verify error bit length of the K dies of non-volatile memories 300 falls within a range of a capability allocated to an error bit length tolerance of an error correction code, the non-volatile memory write control unit 230 determines that writing has succeeded on the assumption that correction can be performed by the ECC decoder 260 at the time of reading. On the other hand, if the total verify error bit length of the K dies of non-volatile memories 300 falls outside the range of the capability allocated to the error bit length tolerance of the error correction code, the non-volatile memory write control unit 230 determines that the writing has failed. Therefore, the non-volatile memory write control unit 230 returns a write response according to the determination to the host computer 100. Note that the non-volatile memory write control unit 230 is an example of a write control unit described in the claims.

The verify error bit read control unit 240 reads the verify error bit lengths from the K dies of non-volatile memories 300, and supplies the total verify error bit length of all the dies to the non-volatile memory write control unit 230 according to an instruction from the non-volatile memory write control unit 230. Note that the verify error bit read control unit 240 is an example of an error bit length acquisition unit described in the claims.

The read control unit 250 controls reading from the non-volatile memory 300. When receiving a read command from the host computer 100, the read control unit 250 outputs a read request to the multi-die control unit 210. Therefore, the multi-die control unit 210 issues the read request to the K dies of non-volatile memories 300, and as a result, the multi-die control unit 210 receives read data from the K dies of non-volatile memories 300.

The ECC decoder 260 performs error correction using an error correction code on the read data of the K die received by the multi-die control unit 210 from the non-volatile memory 300. In a case where the error correction has succeeded even if any of the read data from the K dies of non-volatile memories 300 includes an error, the corrected read data is supplied to the host computer 100.

Figure 6:
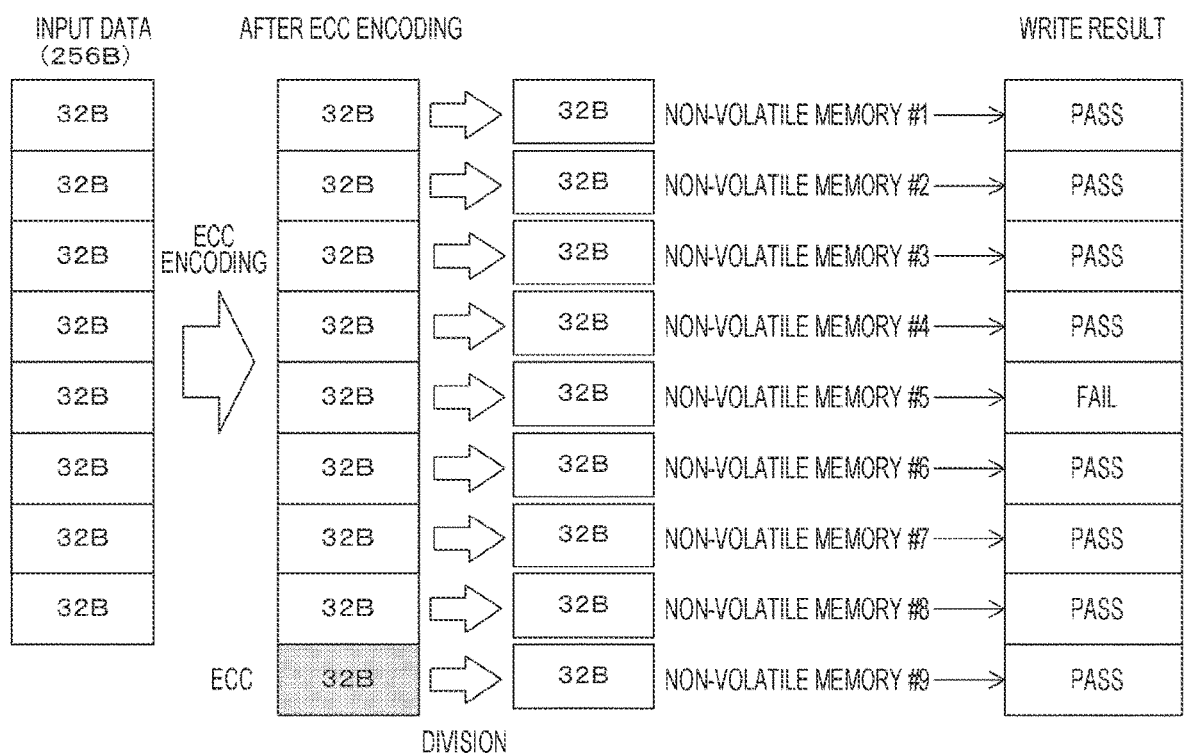
FIG. 6 is a diagram illustrating a division example of write data in the memory controller 200 in the first embodiment of the present technology.

FIG. 6 is a diagram illustrating a division example of write data in the memory controller 200 in the first embodiment of the present technology.

Here, a specific example when write data from the host computer 100 is divided and written into the K dies of non-volatile memories 300 will be described. In this example, a size of the write data is assumed to be 256 bytes (32 bytes×8), and the number of dies of the non-volatile memories 300 is assumed to be nine dies.

The ECC encoder 220 generates a 32-byte error correction code for the input 256-byte write data. Therefore, a size after encoding is 288 bytes.

The multi-die control unit 210 divides the encoded 288-byte data into nine pieces and outputs the divided pieces in parallel to the nine dies of non-volatile memories 300. Therefore, each of the non-volatile memories 300 writes data of 32 bytes at a time. As a result, in this example, it is indicated that a verify result is "fail" in the fifth non-volatile memory 300, and verify results are "pass" in the others.

The error correction code generated by the ECC encoder 220 has a correction capability including the number of verify errors allowable at the time of writing. Assuming that encoded data is written in the K dies of non-volatile memories 300 and N bits are allowed in each of the dies, an extra correction capability corresponding to N×K bits is required as a whole. Assuming that a correction capability for M bits is required to support an RBER of the non-volatile memory, a correction capability for "K×N+M" bits is required in total.

For example, if all the verify results are "pass", the verify errors are equal to or less than N×K bits, and thus, can be corrected by the ECC decoder 260. Furthermore, when the verify result of at least one die is "fail" as in the above-described example, it is necessary to confirm whether or not the verify errors are equal to or less than N×K bits in order to determine whether or not the ECC decoder 260 can perform correction. The verify error bit lengths of the nine dies are read and calculated, and a response is made as a writing success if a total verify error bit length is equal to or less than N×K bits, and a response is made as a writing failure if the total verify error bit length is more than N×K bits.

[Operation of Memory Controller]

Figure 7:
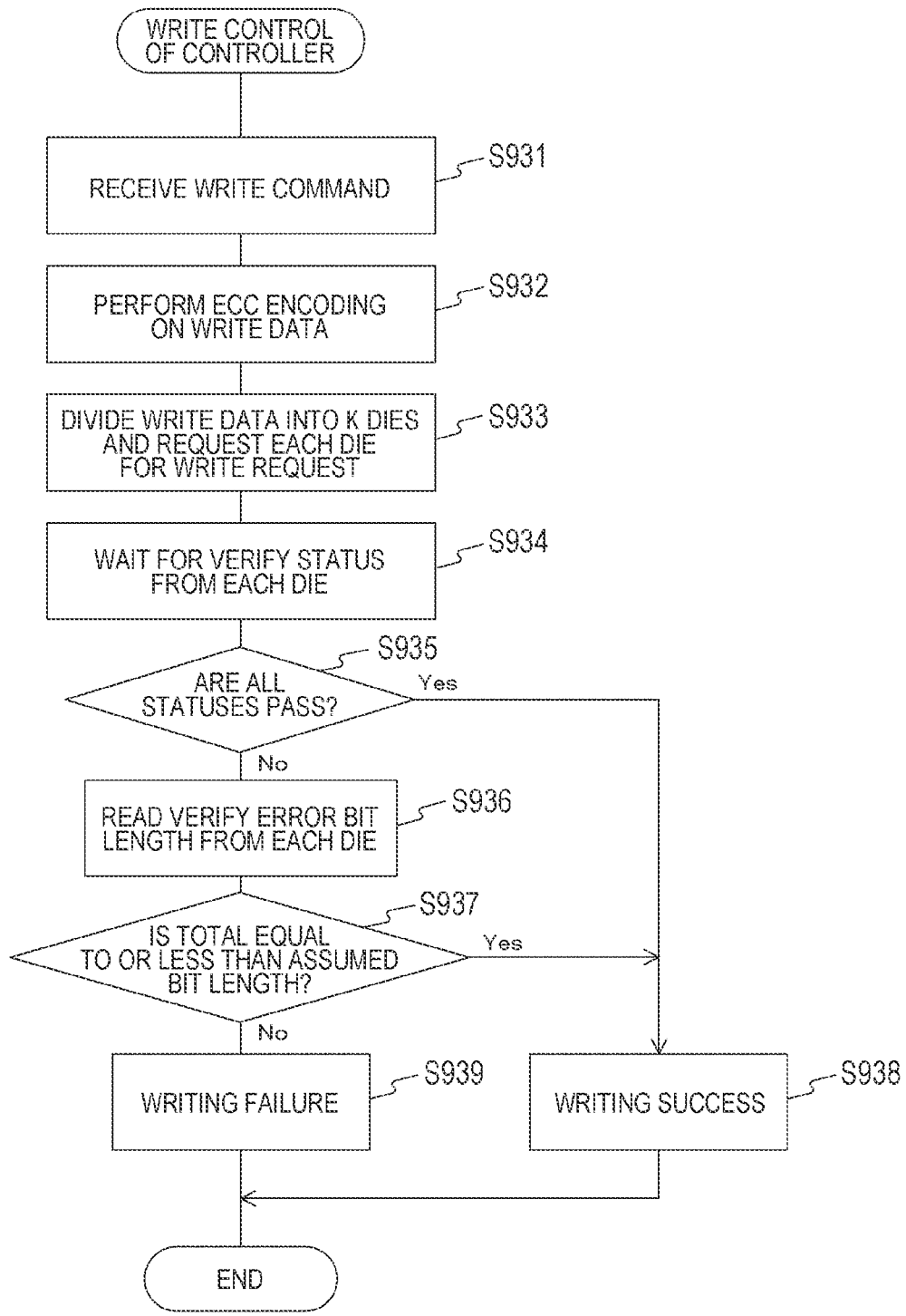
FIG. 7 is a flowchart illustrating an example of a write control procedure of the memory controller 200 in the first embodiment of the present technology.

FIG. 7 is a flowchart illustrating an example of a write control procedure of the memory controller 200 in the first embodiment of the present technology.

When the memory controller 200 receives a write command from the host computer 100 (step S931), the ECC encoder 220 generates and encodes an error correction code for write data (step S932). Then, the multi-die control unit 210 divides the encoded write data into K dies and requests each die of the non-volatile memories 300 for a write request (step S933). Then, the multi-die control unit 210 waits for a verify status from each die of the non-volatile memories 300 (step S934).

In a case where the verify statuses from all of the K dies of non-volatile memories 300 indicate "pass" (step S935: Yes), the non-volatile memory write control unit 230 determines that writing has succeeded (step S938).

On the other hand, in a case where the verify status of any of the K dies of non-volatile memories 300 indicates "fail" (step S935: No), the verify error bit read control unit 240 reads verify error bit lengths from the K dies of non-volatile memories 300 (step S936). Then, if a total verify error bit length is equal to or less than an assumed bit length (step S937: Yes), the non-volatile memory write control unit 230 determines that the writing has succeeded (step S938). Furthermore, if the total verify error bit length is more than the assumed bit length (step S937: No), the non-volatile memory write control unit 230 determines that the writing has failed (step S939).

Figure 8:
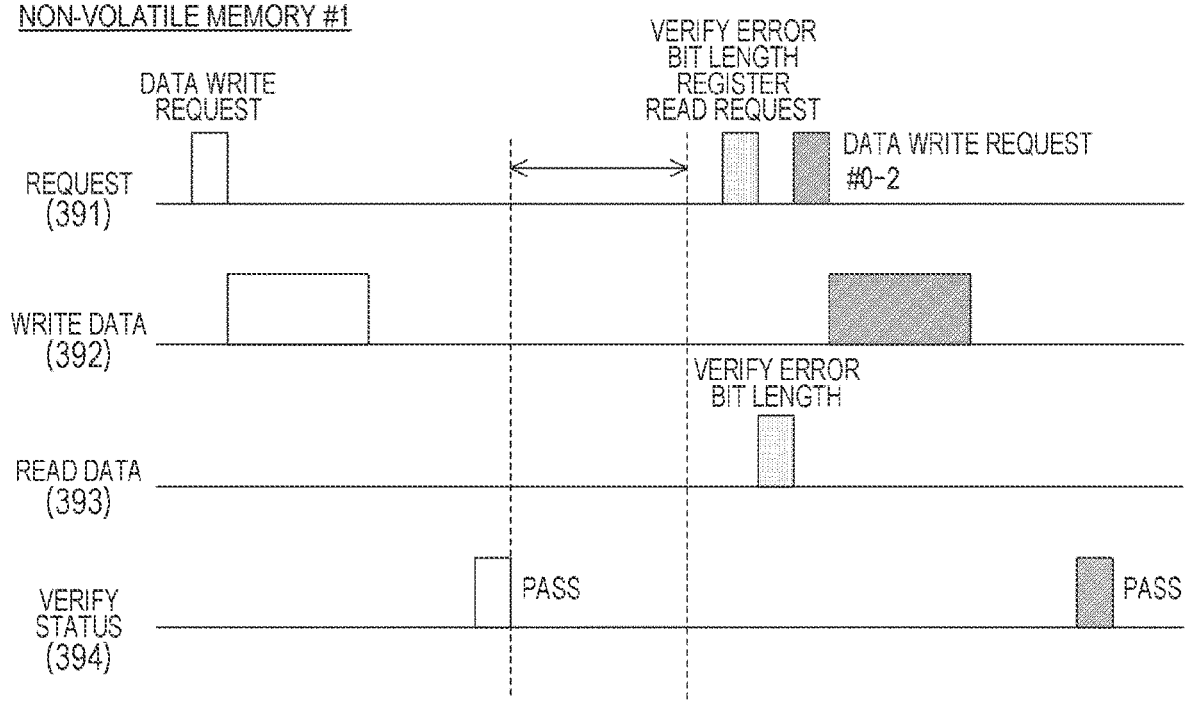
FIG. 8 is a diagram illustrating a timing example in interfaces of a plurality of the non-volatile memories 300 in the first embodiment of the present technology.
Figure 8:
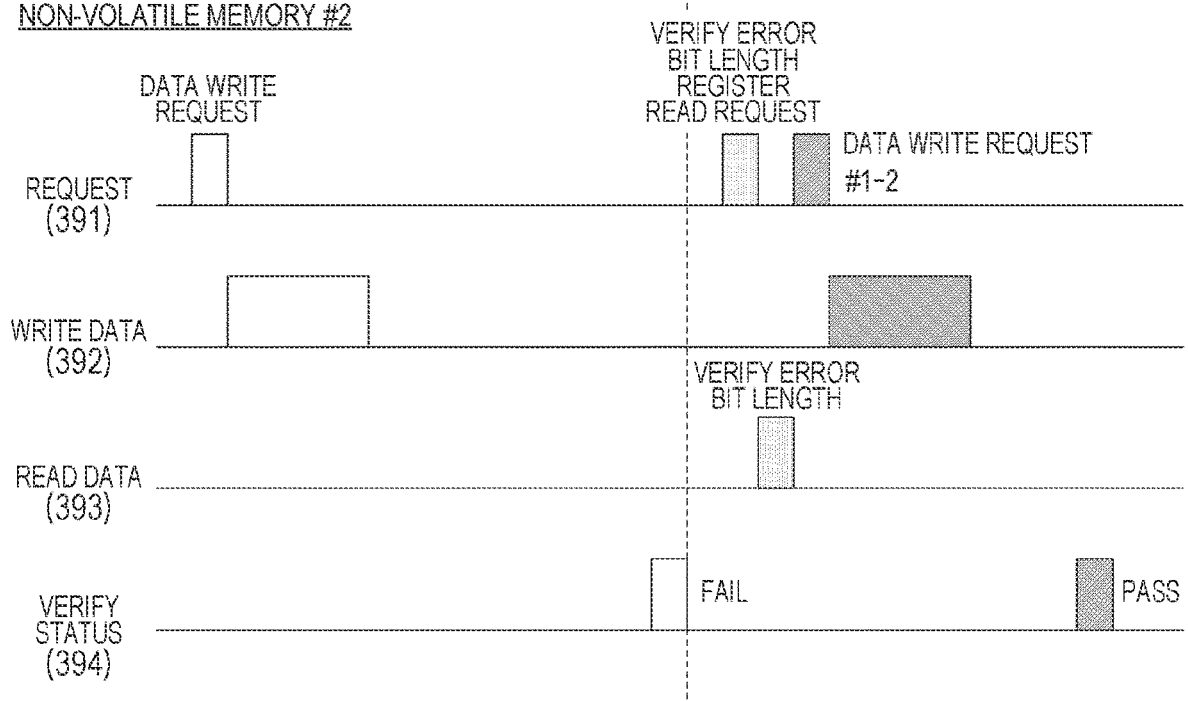

FIG. 8 is a diagram illustrating a timing example in the interfaces of the plurality of non-volatile memories 300 in the first embodiment of the present technology.

After a data write request is issued from the memory controller 200 to the signal lines of the requests 391 of the first and second non-volatile memories 300, write data is output to the respective signal lines of the write data 392. Thereafter, a write operation is performed in each of the memory cell arrays 310, and each of the write completion determination units 360 outputs the completion notification indicating "pass" or "fail" to the signal line of the verify status 394. This example assumes a case where the verify status 394 of the first non-volatile memory 300 is "pass" and the verify status 394 of the second non-volatile memory 300 is "fail".

At the time of writing in the non-volatile memory, program processing is performed internally, a verify operation as to whether or not the writing has been performed correctly is performed, and the program processing is performed again in a case where the writing has not been performed normally, and thus, a time for writing differs depending on the number of times of verification, and is variable. In this example, the output of a verify result is delayed due to rewriting performed in the second non-volatile memory 300. Therefore, there is a possibility that the number of verify errors is referred to even if the next writing can be performed at an earlier stage in the first non-volatile memory 300, and thus, the non-volatile memory write control unit 230 does not issue the next write request until all verify results are obtained. Note that this point will be improved in the following second embodiment.

In this manner, the verify error bit length register 370 is provided in each of the plurality of non-volatile memories 300 in the first embodiment of the present technology, and in the case where the verify error occurs in at least any of the plurality of non-volatile memories 300, a value thereof is acquired. Then, it is determined that the writing has succeeded if the total verify error bit length falls within the range of the capability allocated to the error bit length tolerance of the error correction code of the ECC decoder 260. Therefore, even in a case where writing fails in each of the non-volatile memories 300, the failure is allowable as long as error correction is possible as a whole, and a high-speed memory module with a low latency can be configured.

2. Second Embodiment

In the above-described first embodiment, only the latest verify result is held in the non-volatile memory 300, and thus, it is difficult to issue the next write request to the non-volatile memory 300 until all the verify results are obtained in the memory controller 200. Therefore, not only the latest verify error bit length but also an immediately previous verify error bit length thereof is held such that the next write request can be issued at an early stage in the second embodiment.

[Configuration of Non-Volatile Memory]

Figure 9:
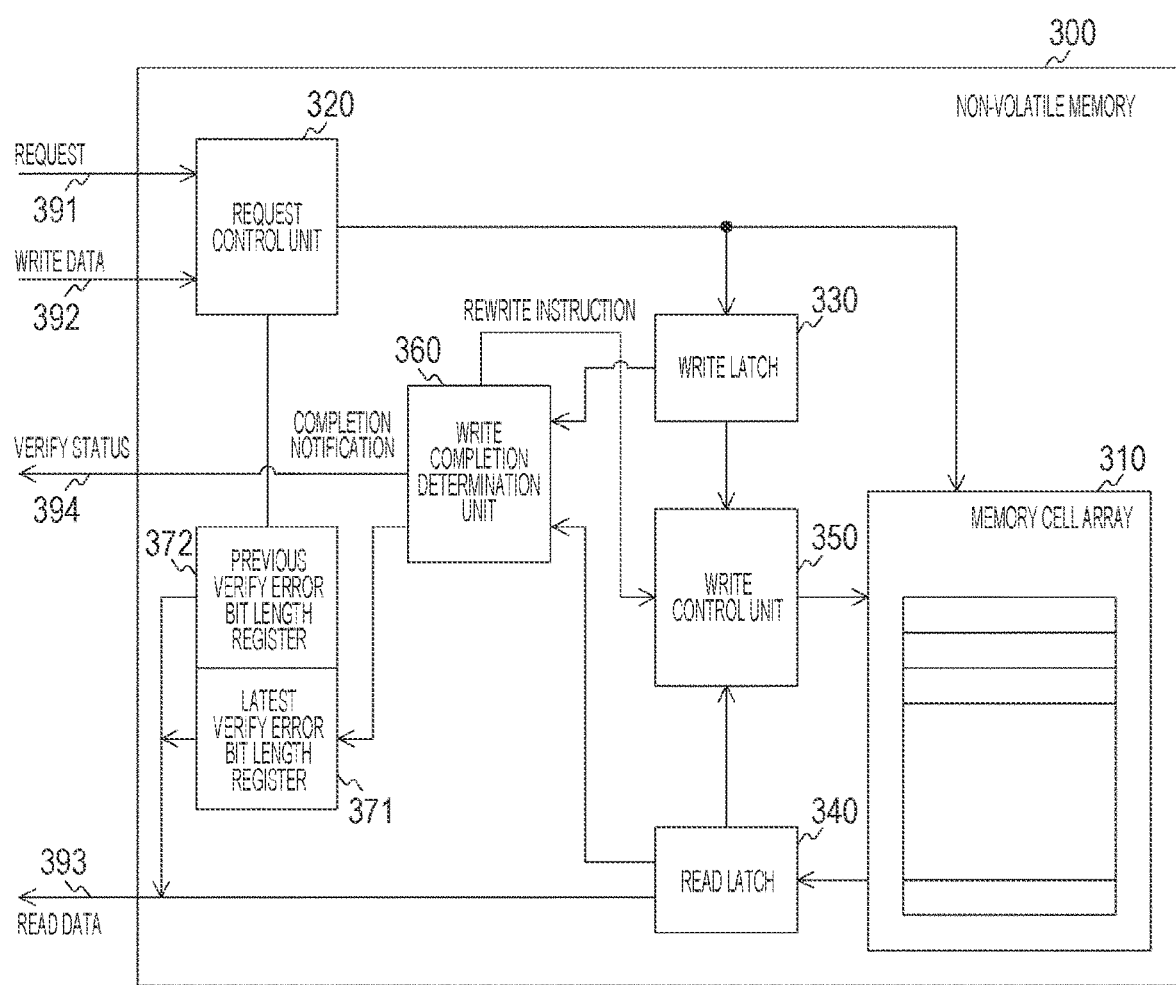
FIG. 9 is a diagram illustrating a configuration example of the non-volatile memory 300 in a second embodiment of the present technology.

FIG. 9 is a diagram illustrating a configuration example of the non-volatile memory 300 in the second embodiment of the present technology.

The non-volatile memory 300 in the second embodiment is different from the non-volatile memory 300 in the above-described first embodiment in terms of including a latest verify error bit length register 371 and a previous verify error bit length register 372. The latest verify error bit length register 371 is a register that holds a verify error bit length in verification of the write completion determination unit 360 performed latest similarly to the verify error bit length register 370 in the first embodiment. The previous verify error bit length register 372 is a register that holds a verify error bit length in immediately preceding verification of the latest verification. That is, the second embodiment is configured to hold the verify error bit lengths corresponding to a total of two times of the latest verification and the immediately preceding verification thereof.

When the write completion determination unit 360 detects a verify error, a verify error bit length thereof is held in the latest verify error bit length register 371. Then, the content that has been held in the latest verify error bit length register 371 so far is held in the previous verify error bit length register 372.

Since a basic configuration of the memory controller 200 is similar to that of the above-described first embodiment, the detailed description thereof will be omitted, but the verify error bit read control unit 240 of the memory controller 200 designates either the latest verify error bit length register 371 or the previous verify error bit length register 372 to read the verify error bit length.

[Operation of Memory Controller]

Figure 10:
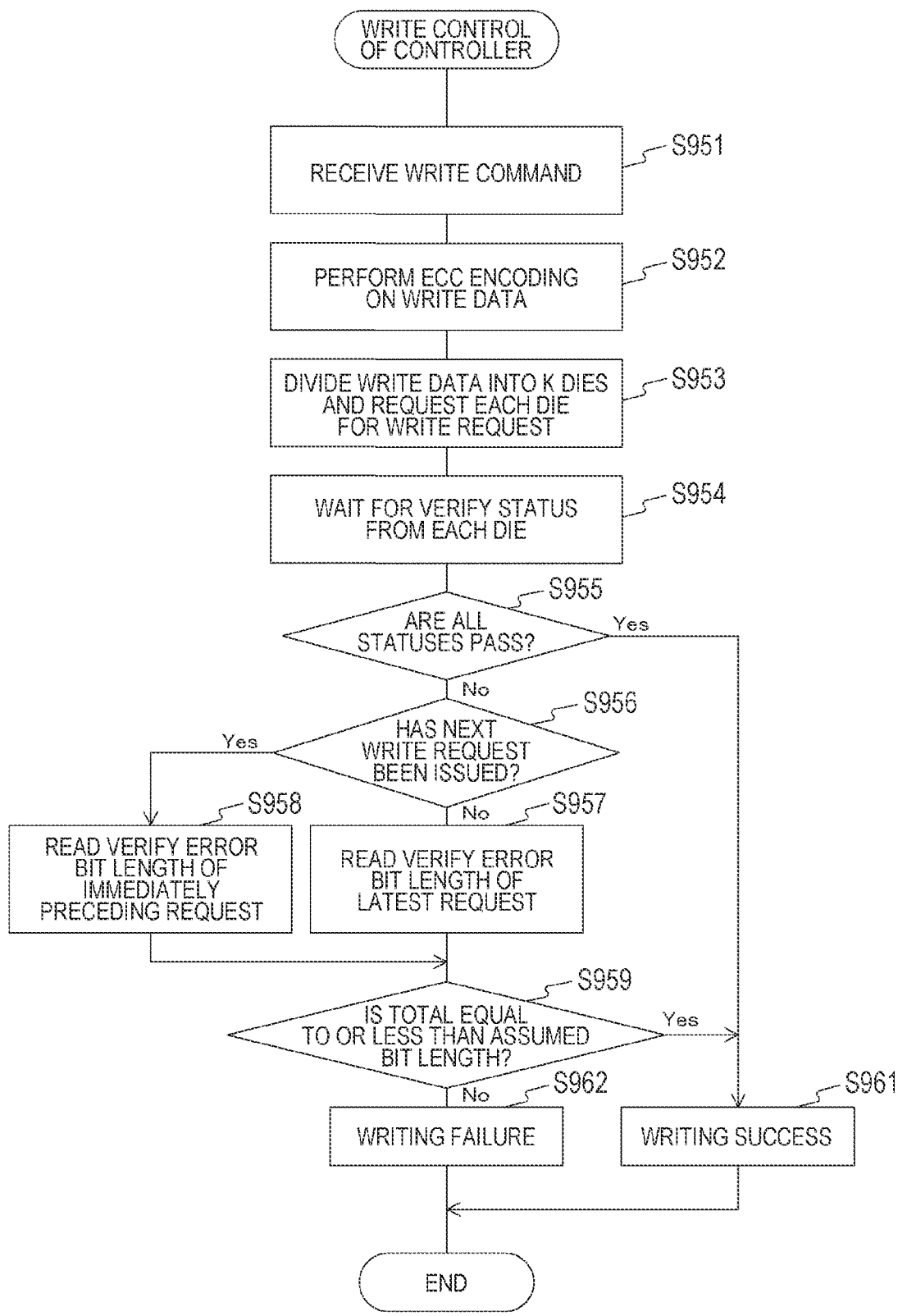
FIG. 10 is a flowchart illustrating an example of a write control procedure of the memory controller 200 in the second embodiment of the present technology.

FIG. 10 is a flowchart illustrating an example of a write control procedure of the memory controller 200 in the second embodiment of the present technology.

When the memory controller 200 receives a write command from the host computer 100 (step S951), the ECC encoder 220 generates and encodes an error correction code for write data (step S952). Then, the multi-die control unit 210 divides the encoded write data into K dies and requests each die of the non-volatile memories 300 for a write request (step S953). Then, the multi-die control unit 210 waits for a verify status from each die of the non-volatile memories 300 (step S954).

In a case where the verify statuses from all of the K dies of non-volatile memories 300 indicate "pass" (step S955: Yes), the non-volatile memory write control unit 230 determines that writing has succeeded (step S961).

On the other hand, in a case where the verify status of any of the K dies of non-volatile memories 300 indicates "fail" (step S955: No), the verify error bit read control unit 240 reads verify error bit lengths from the K dies of non-volatile memories 300 (step S957 or S958). At this time, if the next write request has been issued (step S956: Yes), the verify error bit read control unit 240 reads a verify error bit length of an immediately preceding request from the previous verify error bit length register 372 (step S958). If the next write request has not been issued (step S956: No), the verify error bit read control unit 240 reads a verify error bit length of the latest request from the latest verify error bit length register 371 (step S957).

Then, if a total of the read verify error bit lengths is equal to or less than an assumed bit length (step S959: Yes), the non-volatile memory write control unit 230 determines that the writing has succeeded (step S961) Furthermore, if the total verify error bit length is more than the assumed bit length (step S959: No), the non-volatile memory write control unit 230 determines that the writing has failed (step S962).

Figure 11:
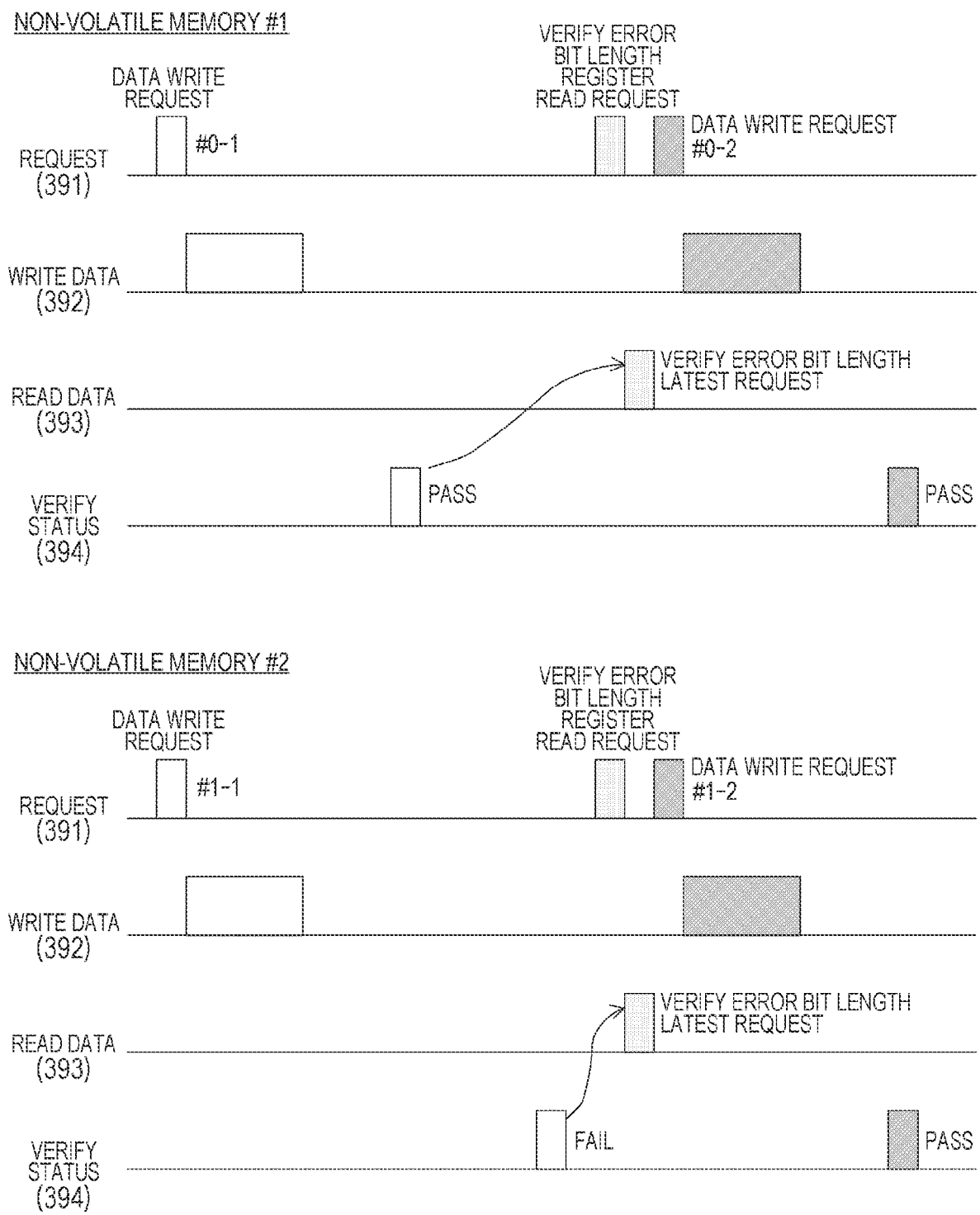
FIG. 11 is a diagram illustrating a first timing example in interfaces of a plurality of the non-volatile memories 300 in the second embodiment of the present technology.

FIG. 11 is a diagram illustrating a first timing example in interfaces of a plurality of the non-volatile memories 300 in the second embodiment of the present technology.

This first timing example assumes a case where reading of a verify error bit after issuing the first data write request is performed before issuing the second data write request. In this case, the verify error bit read control unit 240 reads a verify error bit length of the latest request from the latest verify error bit length register 371. Timings in this case are similar to those in the above-described first embodiment.

Figure 12:
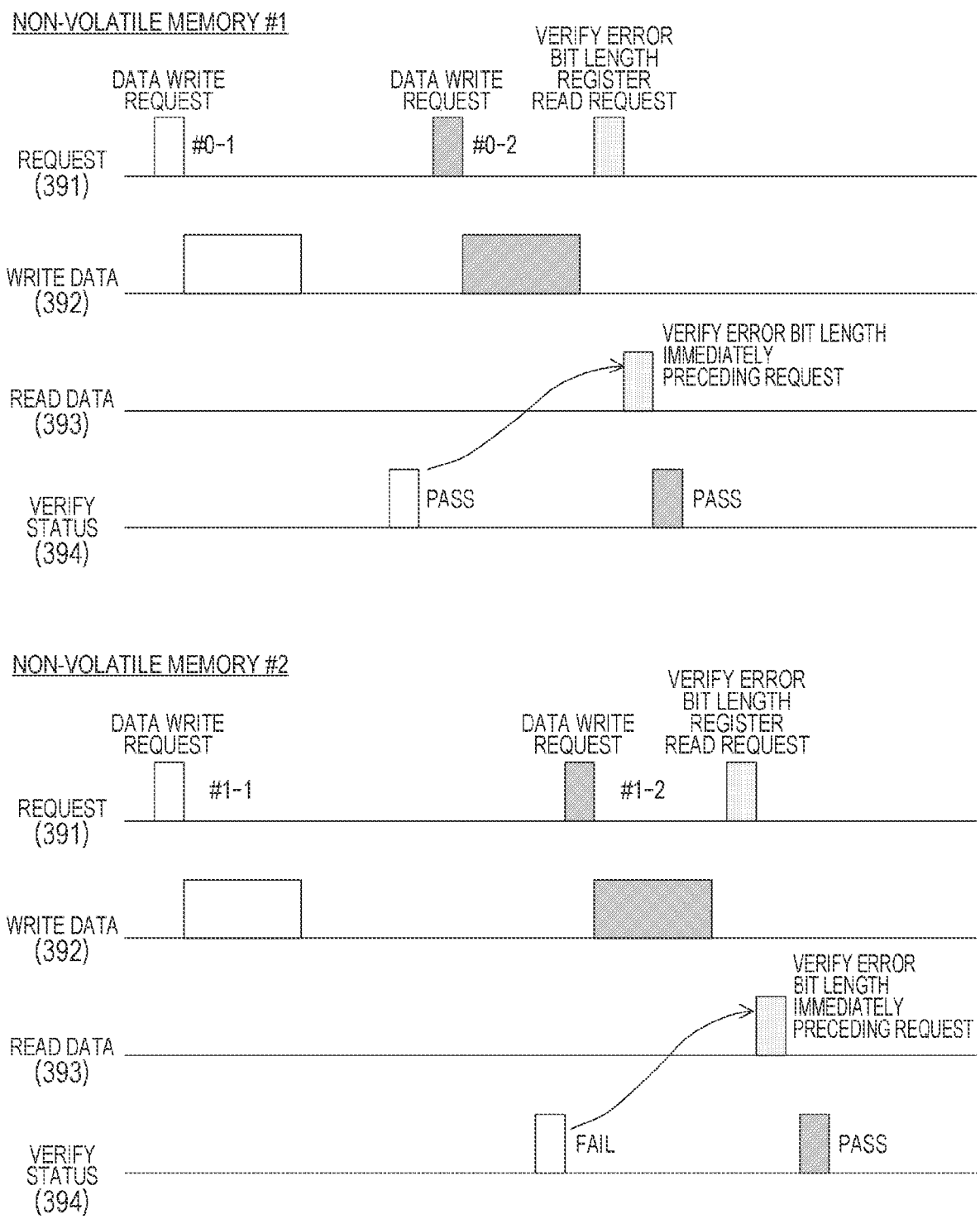
FIG. 12 is a diagram illustrating a second timing example in the interfaces of the plurality of non-volatile memories 300 in the second embodiment of the present technology.

FIG. 12 is a diagram illustrating a second timing example in the interfaces of the plurality of non-volatile memories 300 in the second embodiment of the present technology.

This second timing example assumes a case where reading of a verify error bit after issuing the first data write request is performed after issuing the second data write request. In this case, the verify error bit read control unit 240 reads a verify error bit length of an immediately preceding request from the previous verify error bit length register 372.

In other words, the second data write request can be issued without waiting for reading of the verify error bit after issuing the first data write request in the second embodiment. Therefore, a transfer rate of data writing can be improved.

In this manner, it is possible to promptly issue a subsequent data write request by providing the latest verify error bit length register 371 and the previous verify error bit length register 372 according to the second embodiment of the present technology.

3. Third Embodiment

[Configuration of Non-Volatile Memory]

Figure 13:
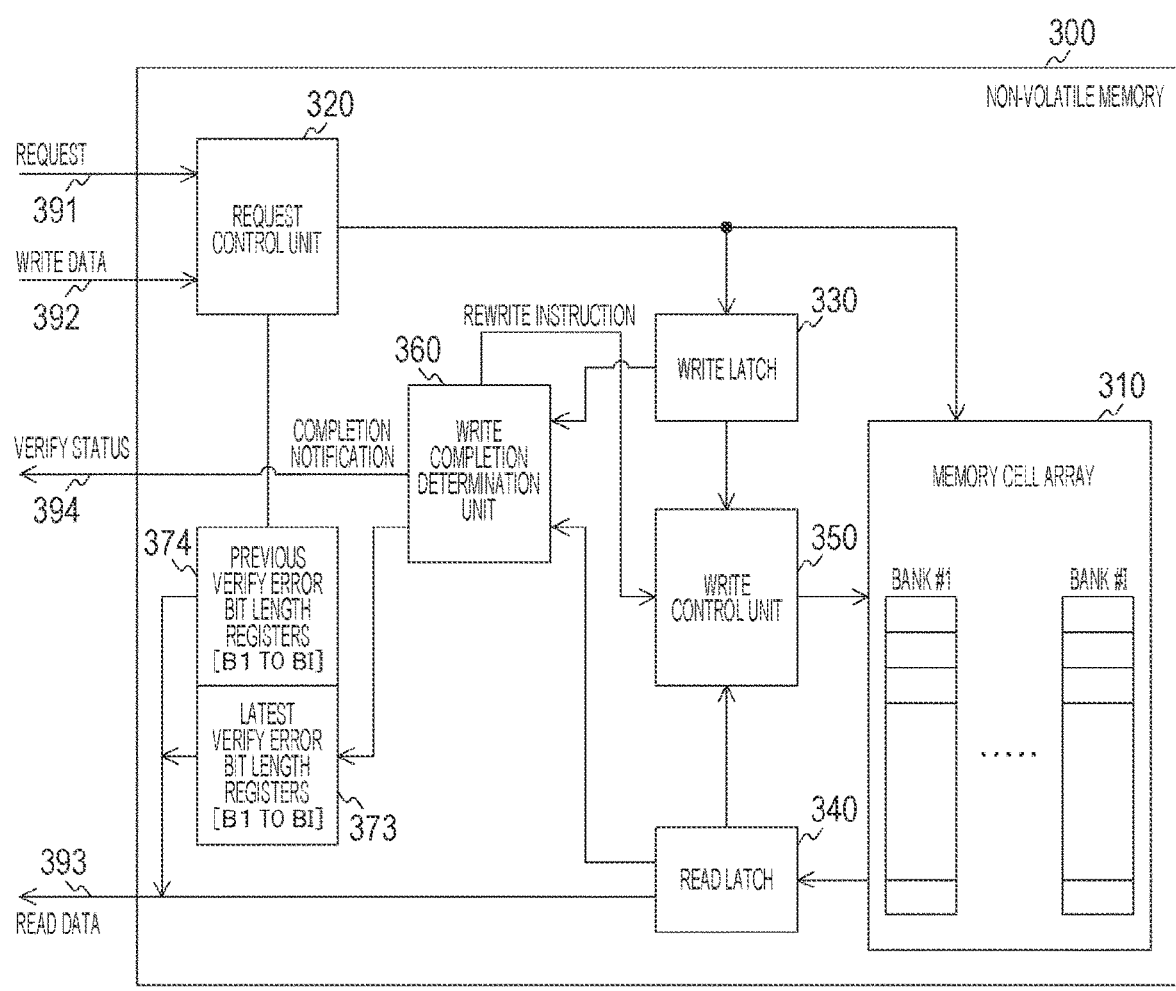
FIG. 13 is a diagram illustrating a configuration example of the non-volatile memory 300 in a third embodiment of the present technology.

FIG. 13 is a diagram illustrating a configuration example of the non-volatile memory 300 in a third embodiment of the present technology.

The non-volatile memory 300 in the third embodiment is assumed to include a plurality of memory banks accessible in parallel by the memory cell array 310. In this example, a memory bank configuration including I (I is an integer of two or more) memory banks is illustrated.

Accordingly, a register for holding a verify error bit length is also provided to correspond to each of the memory banks, and includes I latest verify error bit length registers 373 and I previous verify error bit length registers 374. Therefore, when writing is performed with respect to the plurality of memory banks in parallel, the latest verify error bit length and an immediately preceding verify error bit length thereof can be referred to for each of the memory banks, and the second data write request can be issued without waiting for reading of a verify error bit after issuing the first data write request, which is similar to the above-described second embodiment.

In this manner, it is possible to promptly issue a subsequent data write request even in the memory bank configuration by providing the latest verify error bit length register 373 and the previous verify error bit length register 374 for each of the memory banks according to the third embodiment of the present technology.

4. Fourth Embodiment

Although it is assumed that a notification of the verify result is provided through the signal line of the verify status 394 in the above-described embodiment, a notification of another error is further provided in a fourth embodiment.

Figure 14:
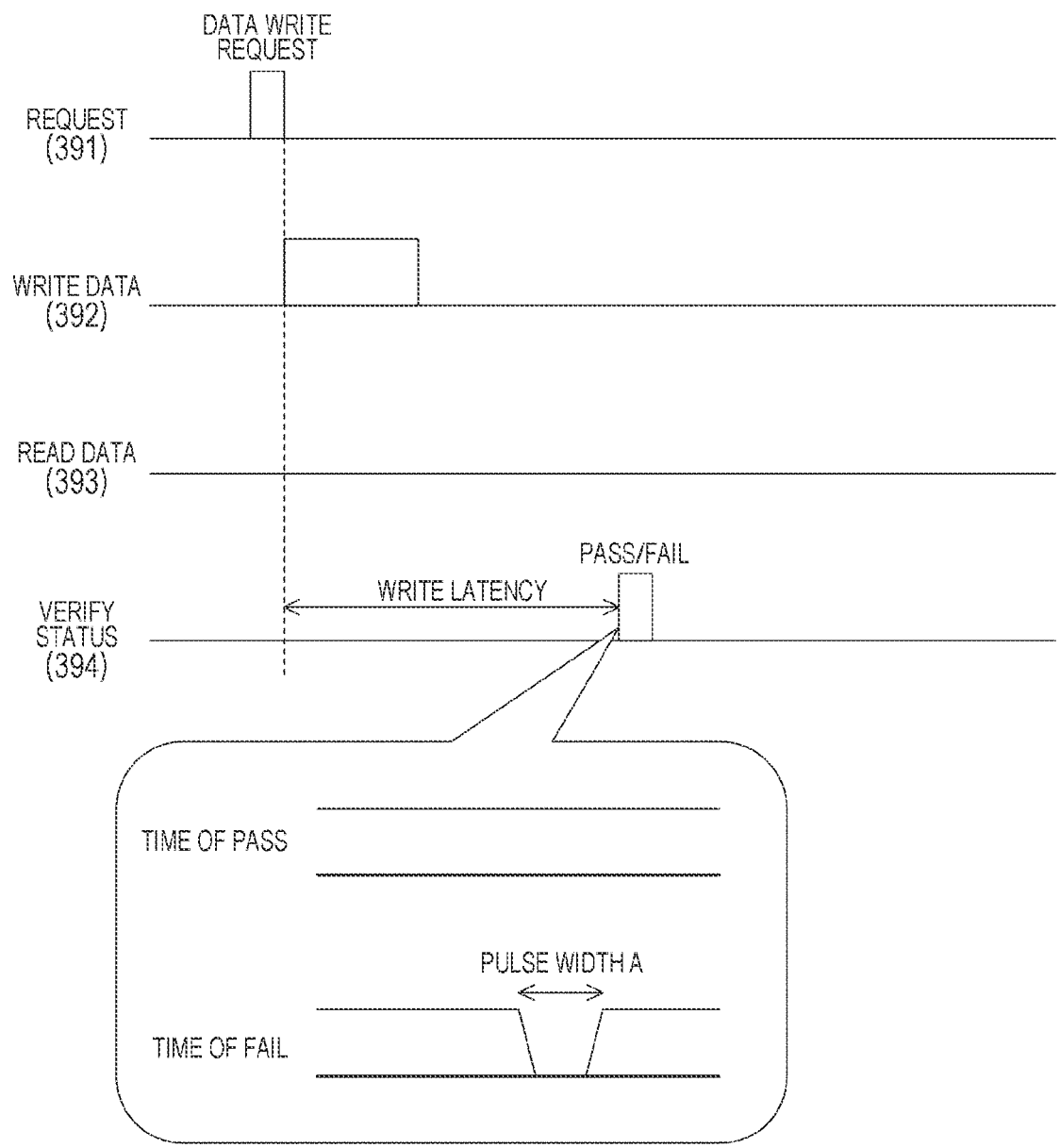
FIG. 14 is a diagram illustrating a first timing example in an interface of the non-volatile memory 300 in a fourth embodiment of the present technology.

FIG. 14 is a diagram illustrating a first timing example in an interface of the non-volatile memory 300 in the fourth embodiment of the present technology.

In this example, a pulse with a pulse width A is indicated in a case where the verify result is "fail" in a 1-bit signal line of the verify status 394 after a fixed latency from issuance of a write request. On the other hand, there is no pulse in a case where the verify result is "pass". Therefore, a notification of "pass" or "fail" can be provided as the verify status using the 1-bit signal line.

Figure 15:
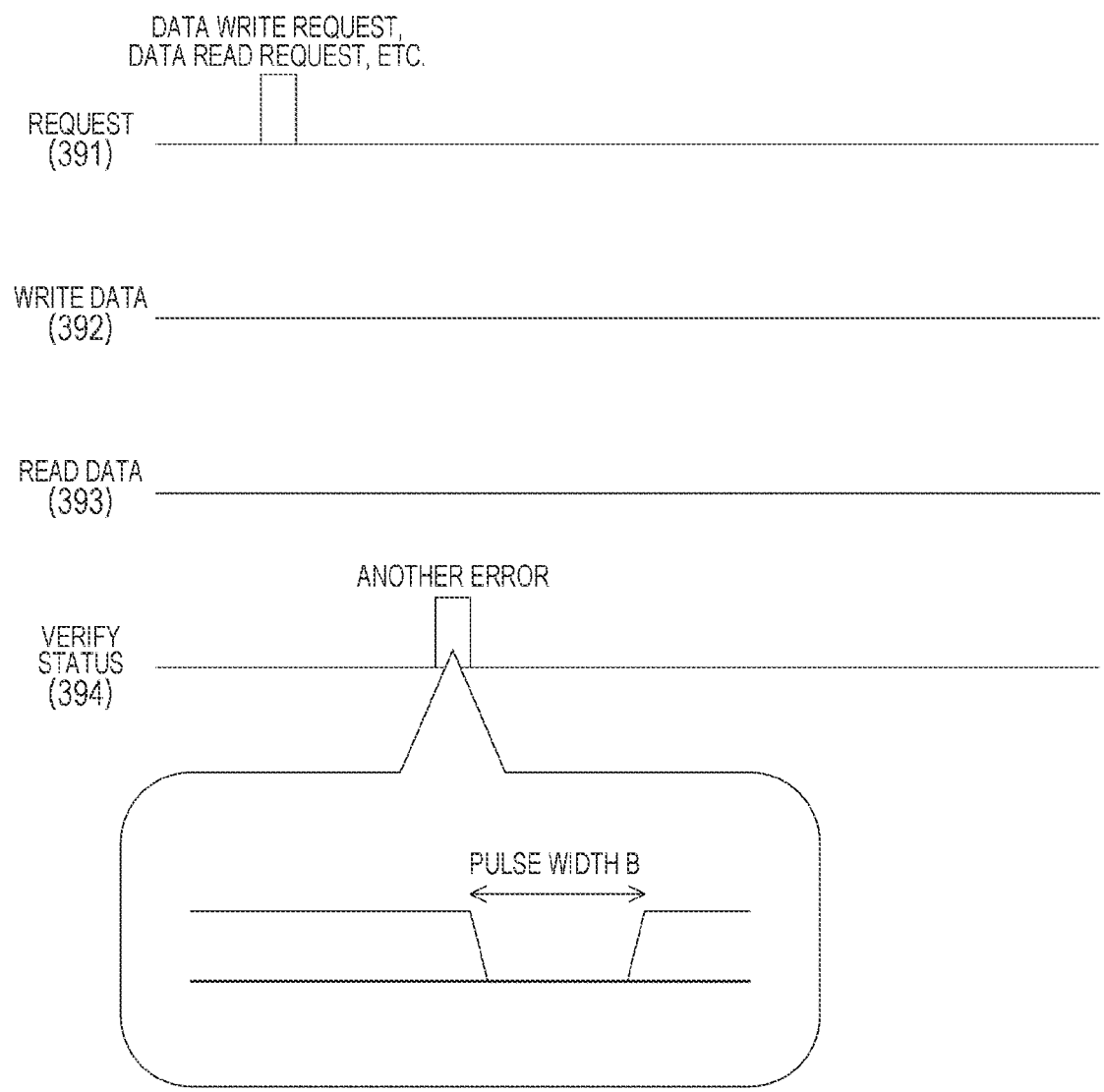
FIG. 15 is a diagram illustrating a second timing example in the interface of the non-volatile memory 300 in the fourth embodiment of the present technology.

FIG. 15 is a diagram illustrating a second timing example in the interface of the non-volatile memory 300 in the fourth embodiment of the present technology.

In this example, when another error occurs, a pulse having a pulse width B is indicated in the 1-bit signal line of the verify status 394. The pulse having the pulse width B is assumed to be wide enough to be distinguishable from the pulse having the pulse width A described above. Furthermore, a timing of the pulse having the pulse width B is not limited to the fixed latency after the request is issued.

As another error in this case, for example, a command address parity error similar to a DRAM is assumed.

In this manner, it is possible to provide a notification of another error in addition to the verify result in the 1-bit signal line of the verify status 394 according to the fourth embodiment of the present technology.

5. Fifth Embodiment

A memory cell failure may be detected in a verify operation by the write completion determination unit 360. Therefore, the presence or absence of occurrence of the memory cell failure is held in the non-volatile memory 300 to enable reading of the presence or absence of occurrence of the memory cell failure from the memory controller 200 in a fifth embodiment.

[Configuration of Non-Volatile Memory]

Figure 16:
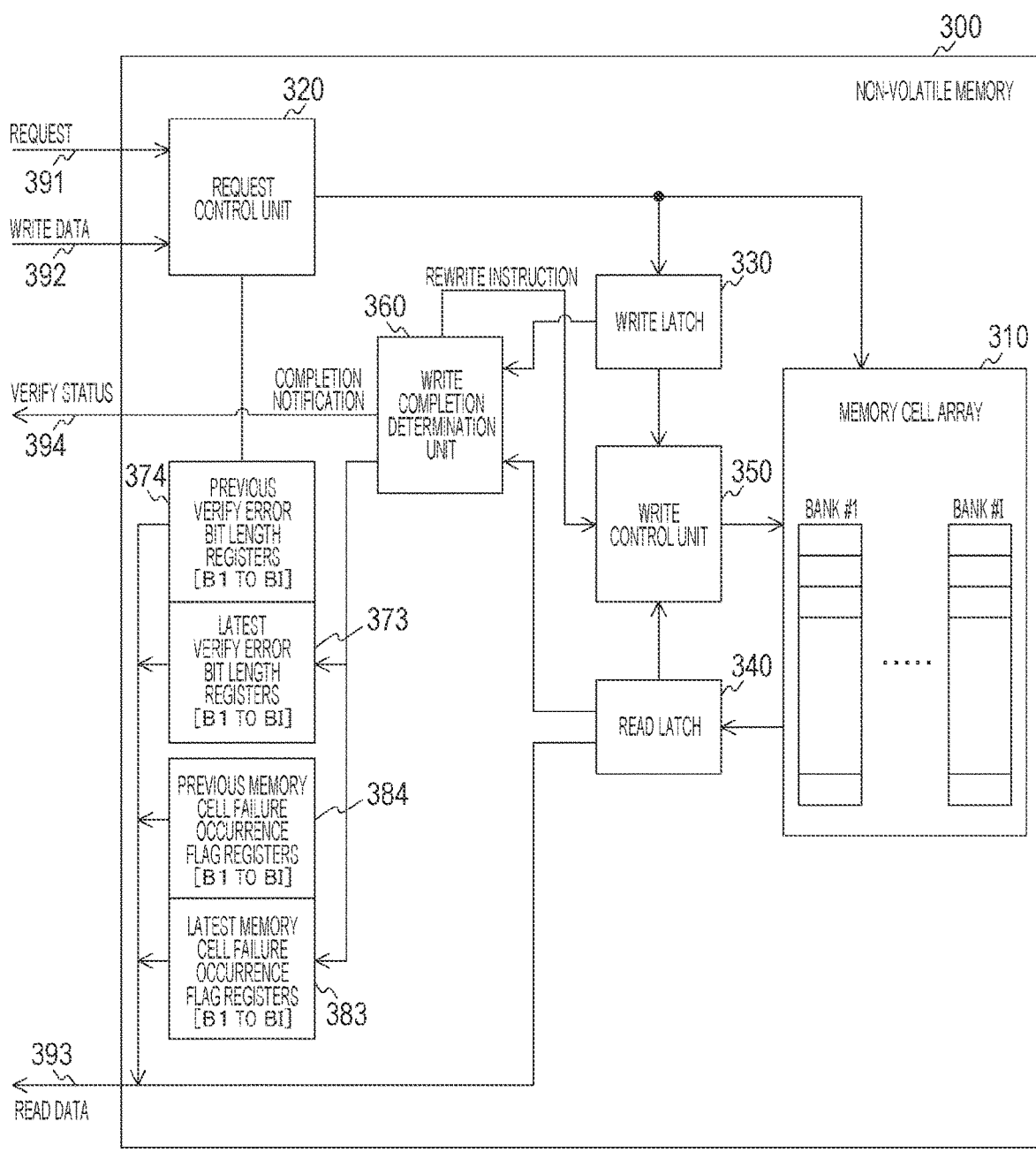
FIG. 16 is a diagram illustrating a configuration example of the non-volatile memory 300 in a fifth embodiment of the present technology.

FIG. 16 is a diagram illustrating a configuration example of the non-volatile memory 300 in the fifth embodiment of the present technology.

The non-volatile memory 300 of the fifth embodiment includes a latest memory cell failure occurrence flag register 383 and a previous memory cell failure occurrence flag register 384 in addition to the latest verify error bit length register 373 and the previous verify error bit length register 374 of the above-described third embodiment. Note that a memory bank configuration is assumed in the fifth embodiment similarly to the above-described third embodiment. Therefore, the latest memory cell failure occurrence flag register 383 and the previous memory cell failure occurrence flag register 384 are provided to correspond to each memory bank.

The latest memory cell failure occurrence flag register 383 is a register that holds a flag indicating whether or not a memory cell failure has occurred in verification of the write completion determination unit 360 performed latest. The previous memory cell failure occurrence flag register 384 is a register that holds a flag indicating whether or not a memory cell failure has occurred in immediately preceding verification of the latest verification.

When the memory cell failure of the memory cell array 310 is detected in a verify operation, the write completion determination unit 360 provides a notification of a verify error using the signal line of the verify status 394 and holds a flag indicating that the memory cell failure has occurred in the latest memory cell failure occurrence flag register 383. Then, the content that has been held in the latest memory cell failure occurrence flag register 383 so far is held in the previous memory cell failure occurrence flag register 384.

In the memory controller 200, when the non-volatile memory write control unit 230 detects the verify error using the signal line having the verify status 394, the verify error bit read control unit 240 reads the latest verify error bit length register 373 and the latest memory cell failure occurrence flag register 383, and performs control according to a type of the error that has occurred. That is, the above-described control related to the verify error is performed when no memory cell failure occurs, and failure control at the time of detecting the memory cell failure is performed when the memory cell failure occurs.

Note that a case where a notification of a verify error has been received in the latest request is assumed in this example, but the verify error bit read control unit 240 reads the previous verify error bit length register 374 and the previous memory cell failure occurrence flag register 384 in a case where another request has already been issued.

In this manner, it is possible to further control the memory cell failure according to the fifth embodiment of the present technology.

Note that the above-described embodiments illustrate examples for embodying the present technology, and the matters in the embodiments respectively have correspondence relationships with the matters specifying the invention in the claims. Similarly, the matters specifying the invention in the claims respectively have correspondence relationships with the matters in the embodiments of the present technology having the same names. However, the present technology is not limited to the embodiments, and can be embodied by making various modifications to the embodiments within the scope not departing from the gist thereof.

Furthermore, processing procedures described in the above-described embodiment may be regarded as a method including these series of procedures, and may be regarded as a program for causing a computer to execute these series of procedures or a recording medium storing the program. As this recording medium, for example, a compact disc (CD), a mini disc (MD), a digital versatile disc (DVD), a memory card, a Blu-ray (registered trademark) disc, or the like can be used.

Note that the effects described in the present specification are merely examples and are not limited, and there may be additional effects.

Note that the present technology can also have the following configurations.

(1) A memory control circuit including:
  a memory access control unit that performs writing by dividing write data and an error correction code for the write data into a plurality of memories and acquires presence or absence of occurrence of a verify error in each of the plurality of memories related to the writing;
  an error bit length acquisition unit that acquires bit lengths of the verify errors from the plurality of memories in a case where the verify errors occur in at least any of the plurality of memories; and
  a write control unit that determines that the writing has succeeded if a total bit length of the verify errors falls within a range of a capability allocated to an error bit length tolerance of the error correction code, and determines that the writing has failed if the total bit length of the verify errors falls outside the range of the capability allocated to the error bit length tolerance of the error correction code in the case where the verify errors occur in at least any of the plurality of memories.

(2) The memory control circuit according to (1), further including an error correction code generation unit that generates the error correction code for the write data.

(3) The memory control circuit according to (1) or (2), in which
  the error bit length acquisition unit requests the plurality of memories for the bit lengths of the verify errors related to the writing after the presence or absence of the occurrence of the verify error is output from all of the plurality of memories related to the writing.

(4) The memory control circuit according to any one of (1) to (3), in which
  in a case where the writing has been performed a plurality of times, the error bit length acquisition unit designates any of the plurality of times of the writing to request the plurality of memories for the bit lengths of the verify errors.

(5) The memory control circuit according to any one of (1) to (4), in which in a case where each of the plurality of memories includes a plurality of memory banks, the error bit length acquisition unit designates any of the plurality of memory banks to request the plurality of memories for the bit lengths of the verify errors.

(6) The memory control circuit according to any one of (1) to (5), in which the memory access control unit acquires presence or absence of occurrence of another error using a signal having a different pulse width from a signal providing a notification of the occurrence of the verify error in a signal line for acquiring the presence or absence of the occurrence of the verify error.

(7) The memory control circuit according to any one of (1) to (6), in which the memory access control unit acquires presence or absence of occurrence of a memory cell failure from the plurality of memories in the case where the verify errors occur in at least any of the plurality of memories.

(8) A memory including:

a memory cell array that performs a write operation of write data in response to a write request;

a write completion determination unit that provides a notification of presence or absence of occurrence of a verify error in the write operation; and a verify error bit length holding unit that holds a bit length of the verify error in the write operation and outputs the bit length of the verify error in response to a request from outside.

(9) The memory according to (8), in which in a case where the write operation is performed a plurality of times, the verify error bit length holding unit holds the bit lengths of the verify errors of at least most recent two times among the plurality of write operations.

(10) The memory according to (8) or (9), in which the memory cell array includes a plurality of memory banks, and the verify error bit length holding unit holds the bit length of the verify error in the write operation for each of the plurality of memory banks.

(11) The memory according to any one of (8) to (10), in which the write completion determination unit provides a notification of presence or absence of occurrence of another error using a signal having a different pulse width from a signal providing a notification of the occurrence of the verify error in a signal line for providing a notification of the presence or absence of the occurrence of the verify error.

(12) The memory according to any one of (8) to (11), further including a memory cell failure occurrence holding unit that holds presence or absence of occurrence of a memory cell failure in the memory cell array and outputs the presence or absence of the occurrence of the memory cell failure in response to a request from outside.

(13) The memory according to any one of (8) to (12), in which the memory cell array is a non-volatile memory.

(14) A memory module including:

a plurality of memories respectively including verify error bit length holding units each of which holds a bit length of a verify error in a write operation;

a memory access control unit that performs writing by dividing write data and an error correction code for the write data into the plurality of memories and acquires presence or absence of occurrence of the verify error in each of the plurality of memories related to the writing;

an error bit length acquisition unit that acquires the bit lengths of the verify errors from the verify error bit length holding units of the plurality of memories in a case where the verify errors occur in at least any of the plurality of memories; and a write control unit that determines that the writing has succeeded if a total bit length of the verify errors falls within a range of a capability allocated to an error bit length tolerance of the error correction code, and determines that the writing has failed if the total bit length of the verify errors falls outside the range of the capability allocated to the error bit length tolerance of the error correction code in the case where the verify errors occur in at least any of the plurality of memories.

REFERENCE SIGNS LIST

100 Host computer
200 Memory controller
210 Multi-die control unit
220 ECC encoder
230 Non-volatile memory write control unit
240 Verify error bit read control unit
250 Read control unit
260 ECC decoder
300 Non-volatile memory
310 Memory cell array
320 Request control unit
330 Write latch
340 Read latch
350 Write control unit
360 Write completion determination unit
370 Verify error bit length register
371 Latest verify error bit length register
372 Previous verify error bit length register
373 Latest verify error bit length register
374 Previous verify error bit length register
383 Latest memory cell failure occurrence flag register
384 Previous memory cell failure occurrence flag register
391 Request (signal line)
392 Write data (signal line)
393 Read data (signal line)
394 Verify status (signal line)
400 Memory module

The invention claimed is:

1. A memory control circuit, comprising:

circuitry configured to:
    divide write data and an error correction code for the write data into a plurality of pieces of data;
    control each memory of a plurality of memories to execute a write operation of a corresponding piece of data of the plurality of pieces of data;
    receive first information indicating one of a success or a failure of the write operation in each memory of the plurality of memories;
    transmit a request to each memory of the plurality of memories based on the failure of the write operation in at least one memory of the plurality of memories;
    receive a plurality of bit lengths of a plurality of verify errors from the plurality of memories based on the transmitted request,
        wherein the plurality of verify errors is associated with the write operation each memory of the plurality of memories;

determine the write operation of the plurality of pieces of data has succeeded, in a case where a total bit length of the plurality of bit lengths is within a range associated with an error bit length tolerance of the error correction code; and determine the write operation of the plurality of pieces of data has failed, in a case where the total bit length is outside the range.

2. The memory control circuit according to claim 1, wherein the circuitry is further configured to generate the error correction code for the write data.

3. The memory control circuit according to claim 1, wherein the circuitry is further configured to transmit the request to each memory of the plurality of memories after the first information is output from all of the plurality of memories.

4. The memory control circuit according to claim 1, wherein the circuitry is further configured to:
control each memory of the plurality of memories to execute the write operation a plurality of times; and
designate one of the plurality of times of the write operation to request the plurality of memories for the plurality of bit lengths of the plurality of verify errors.

5. The memory control circuit according to claim 1, wherein
each memory of the plurality of memories includes a plurality of memory banks, and
the circuitry is further configured to designate one memory bank of the plurality of memory banks to request the plurality of memories for the plurality of bit lengths of the plurality of verify errors.

6. The memory control circuit according to claim 1, wherein the circuitry is further configured to:
receive, from a signal line, a first signal including the first information; and
receive, from the signal line, a second signal including second information, wherein
the second information indicates one of an occurrence or a non-occurrence of a specific error, and
the second signal has pulse width different from a pulse width of the first signal.

7. The memory control circuit according to claim 1, wherein the circuitry is further configured to receive, based on the failure of the write operation in the at least one memory, second information indicating one of an occurrence or a non-occurrence of a memory cell failure from the plurality of memories.

8. A memory, comprising:
circuitry configured to receive a write request from a memory controller;
a memory cell array configured to execute a write operation of write data based on the write request,
wherein the circuitry is further configured to:
transmit a first notification indicating one of a success or a failure of the write operation; and
receive a first request from the memory controller based on the transmitted first notification; and
a verify error bit length register configured to:
hold a bit length of a verify error associated with the write operation; and
output the bit length of the verify error based on the first request from the memory controller.

9. The memory according to claim 8, wherein
the memory cell array is further configured to execute the write operation a plurality of times, the verify error bit length register is further configured to hold bit lengths of a plurality of verify errors of at least most recent two times among the plurality of times of the write operation, and
the plurality of verify errors includes the verify error.

10. The memory according to claim 8, wherein
the memory cell array includes a plurality of memory banks, and
the verify error bit length register is further configured to hold the bit length of the verify error in the write operation for each bank of the plurality of memory banks.

11. The memory according to claim 8, wherein
the circuitry is further configured to:
transmit, through a signal line, a first signal including the first notification; and
transmit, through the signal line, a second signal including a second notification,
the second notification indicates one of an occurrence or a non-occurrence of a specific error, and
the second signal has pulse width different from a pulse width of the first signal.

12. The memory according to claim 8, further comprising a memory cell failure occurrence register configured to hold information indicating one of an occurrence or a non-occurrence of a memory cell failure in the memory cell array, wherein
the circuitry is further configured to receive a second request from the memory controller, and
the memory cell failure occurrence register is further configured to output the information indicating the one of the occurrence or the non-occurrence of the memory cell failure based on the second request from the memory controller.

13. The memory according to claim 8, wherein the memory cell array is a non-volatile memory.

14. A memory module, comprising:
a plurality of memories that includes a plurality of verify error bit length registers; and
circuitry configured to:
divide write data and an error correction code for the write data into a plurality of pieces of data;
control each memory of the plurality of memories to execute a write operation of a corresponding piece of data of the plurality of pieces of data;
receive information indicating one of a success or a failure of the write operation in each memory of the plurality of memories;
transmit a request to each memory of the plurality of memories based on the failure of the write operation in at least one memory of the plurality of memories, wherein the plurality of verify error bit length registers is configured to hold a plurality of bit lengths of a plurality of verify errors associated with the write operation in each memory of the plurality of memories;
receive the plurality of bit lengths from the plurality of verify error bit length registers based on the transmitted request;
determine the write operation of the plurality of pieces of data has succeeded, in a case where a total bit length of the plurality of bit lengths is within a range associated with an error bit length tolerance of the error correction code; and determine the write operation of the plurality of pieces of data has failed, in a case where the total bit length is outside the range.

\* \* \* \* \*